PULSE SHAPING GENERATOR EMPLOYING PLURAL STEP-RECOVERY DIODES

Filed March 15, 1965 5 Sheets-Sheet 1

INVENTOR.
EDGAR STROMER
BY Clifton E. Clouse, Jr.
Agent

PULSE SHAPING GENERATOR EMPLOYING PLURAL STEP-RECOVERY DIODES

Filed March 15, 1965 5 Sheets-Sheet 4

United States Patent Office 3,369,131
Patented Feb. 13, 1968

3,369,131

PULSE SHAPING GENERATOR EMPLOYING PLURAL STEP-RECOVERY DIODES

Edgar Stromer, Mannedorf, Switzerland, assignor to SCM Corporation, New York, N.Y., a corporation of New York Filed Mar. 15, 1965, Ser. No. 439,872
7 Claims. (Cl. 307—281)

ABSTRACT OF THE DISCLOSURE

Circuits employing step-recovery diodes in cascade provide improved pulse rise and fall times of the order of less than one nanosecond. Respective sets of such cascaded diodes are used together with appropriate delay circuits and analog adders to define pulse width. Paralleling two such circuits provides a simple realization of a double pulse generator.

The invention relates to pulse generators in which pulses having very fast rise and fall times are developed, and more particularly the invention pertains to a double pulse generator that includes a cascade arrangement of step recovery diodes to obtain pulses with rise and fall times of less than one nanosecond.

It is desirable in pulse generators to obtain pulses that not only have fast rise and fall times but are of sufficient amplitude and power for application to a load circuit. It is further desirable that pulse width and spacing be easily controlled and that dependence of pulse width and spacing on temperature, power supply fluctuations, and input waveform fluctuations be minimized.

Known pulse generators for developing pulses having rise and fall times of less than one nanosecond have lacked ease of control of pulse width and spacing and have experienced a loss of power and amplitude upon application to a load circuit. There are also problems of dependence of pulse width and spacing on temperature, power supply fluctuations, and input waveform fluctuations. Still another problem is found in known pulse generators in which double pulses are generated by multiple reflections in transmission lines. These lines cause losses in pulse amplitude due to mismatched impedances and deterioration of rise time due to skin effect losses in the cabling.

It is an object of the invention to generate pulses having rise and fall times of less than one nanosecond.

Another object of the invention is to improve the rise time of a wave front by application of the wave to a cascade arrangement of step recovery diodes.

Another object is to arrange a series of selected step recovery diodes so that each successive diode has a storage phase longer than the rise time of the preceding diode.

Another object of the invention is to generate double pulses having fast rise and fall times.

Another object is to easily control the spacing between double pulses.

Another object is to minimize dependence of pulse width and spacing on temperature, power supply fluctuations, and input waveform fluctuations in a pulse generator.

In order that the invention may be practiced by others, it is described in terms of an express embodiment, given by way of example only, and with reference to the accompanying drawing in which.

GENERAL DESCRIPTION

Figure 1:
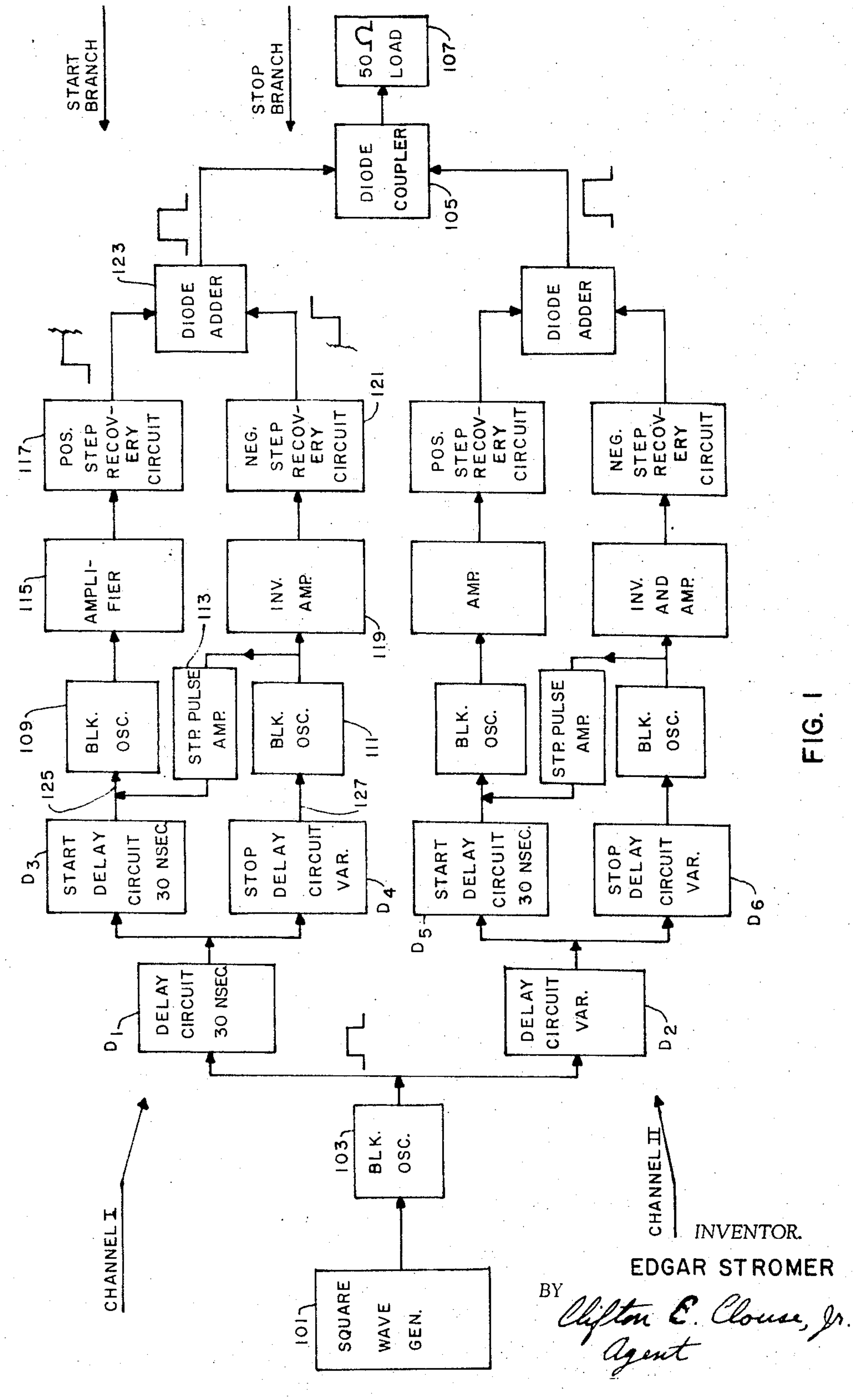
FIGURE 1 is a block diagram of a double pulse generator comprising channels I and II according to the invention.

An embodiment of the invention is shown in the form of a block diagram in FIGURE 1 in which the output of a square wave generator 101 is coupled to the input of a blocking oscillator 103 for producing positive square output pulses. These pulses are applied simultaneously to circuits of the upper and lower halves of FIGURE 1. The upper half is designated as channel I and the lower half as channel II. In response to each pulse from oscillator 103, two step-pulse waveforms are developed, one at the output of each channel for application through a diode coupler 105 to a standard load 107. Both channels I and II are adjustable for varying the width of respective pulses. Channel II, in addition, is adjustable for delaying the generation of pulses with respect to those of channel I to obtain output pulses which are separated in time from the pulses produced in channel I.

Figure 2:
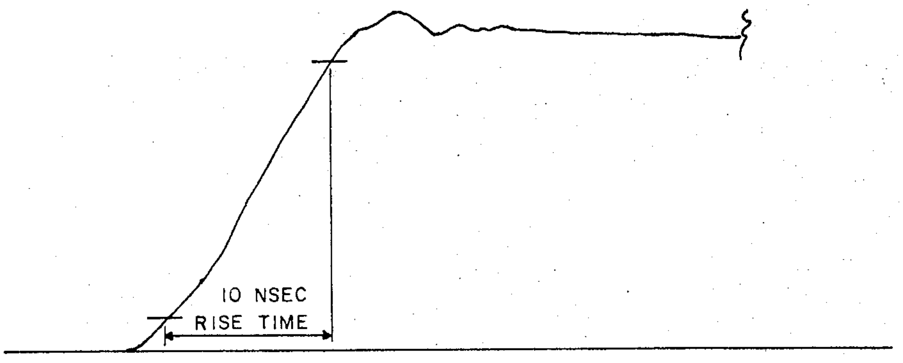
FIGURE 2 shows a representative wave front applied to the input of a delay circuit of the pulse generator of FIGURE 1.

In one embodiment of the invention the square wave generator 101 is of the type that produces output waves at a repetition rate of 50 c.p.s. to 500,000 c.p.s. for application to the blocking oscillator 103. In response thereto, the blocking oscillator produces positive step pulses, each having a leading edge substantially as shown in FIGURE 2, with a representative rise time of 10 nanoseconds. From this single leading edge, the circuits of channels I and II are used, in a manner presently described, to form both leading and trailing edges of respective output pulses. Each of the channels may be adjusted to vary the width of respective output pulses from zero to 100 nanoseconds. Special output circuits in both channels I and II obtain output pulses having rise and fall times of less than 0.4 nanosecond. Channel II, in addition, is adjustable to vary the separation of its output pulses from the pulses of channel I from zero or overlapping to 100 nanoseconds.

Figure 3:
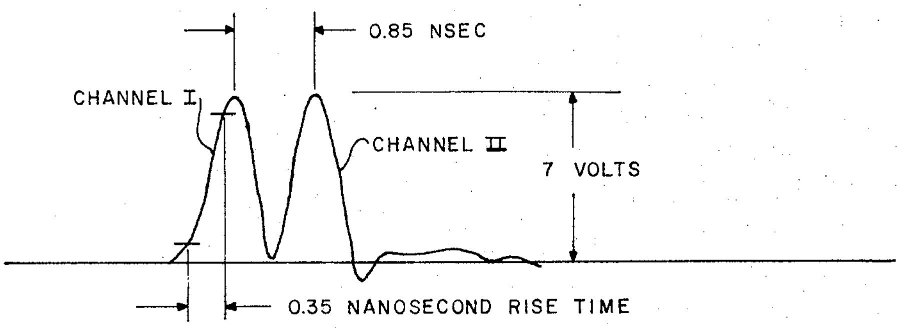
FIGURE 3 shows representative double pulses at the output of the pulse generator of FIGURE 1, having rise and fall times of less than one nanosecond.
Figure 4:
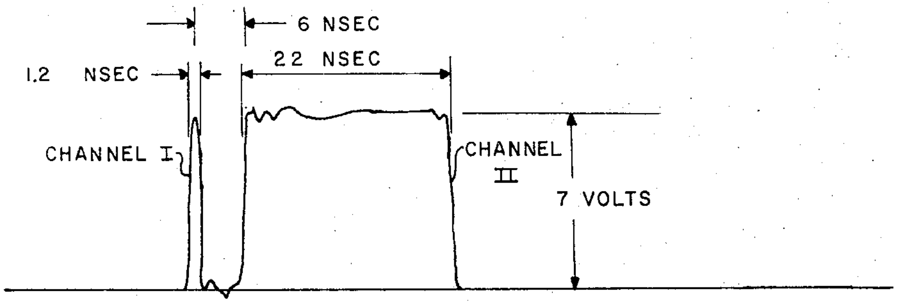
FIGURE 4 shows representative double pulses of different widths generated by the pulse generator of FIGURE 1 according to the invention.

Two representative output pulses of substantially the same width are shown in FIGURE 3 to an expanded scale. These pulses (as well as the wave front of FIGURE 2) are taken from photographs of pulses developed in circuits arranged according to the invention and illustrate the fast rise and fall times possible. FIGURE 3 also illustrates a short separation of 0.85 nanosecond. In FIGURE 4 two pulses are shown to an expanded scale illustrating other possible pulse widths and separation.

In the arrangement of FIGURE 1, various circuits, described hereinafter, utilize an element that has been termed a "step recovery diode" by S. Krakauer in "Harmonic Generation, Rectification, and Lifetime Evaluation With the Step Recovery Diode," Proc. IRE, vol. 50, No.

7, pp. 1665–1676, July 1962. The circuits of the present invention were constructed with the most advanced known step recovery diodes available at the time of construction. However, since the rise and fall times of the output pulses are dependent to a degree on the parameters of the step recovery diodes used, it is anticipated that even faster rise and fall times can be obtained with diodes having improved parameters. Consequently, the values discussed herein are representative only and are intended to clarify the invention rather than limit the invention to the values presented.

The general logical basis for obtaining output pulses such as shown in FIGURES 3 and 4 may be understood generally from a functional description of the blocks of channels I and II. Application of a pulse from the blocking oscillator 103 to the inputs of delay circuits $D_1$ and $D_2$ results in a normalized output from circuit $D_1$ that is delayed 30 nanoseconds from the input pulse, while the output from the circuit $D_2$ may be delayed from a minimum of 30 nanoseconds to a maximum of 130 nanoseconds. The output pulse from channel II, therefore, may be delayed with respect to the output pulse from channel I by an amount which is the difference between the delay of circuit $D_2$ and the delay of circuit $D_1$. This delay determines the spacing between the pulses of channels I and II.

Since the circuits of channel I and channel II, other than circuits $D_1$ and $D_2$, are identical, a description only of the operation of channel I is given.

The normalized output from circuit $D_1$ is of sufficient power to drive a pair of delay circuits $D_3$ and $D_4$. The output pulse from $D_3$ is delayed 30 nanoseconds, while the circuit $D_4$ may be adjusted to produce an output pulse delayed from 30 to 130 nanoseconds.

As will be specifically described hereinafter, the pulse wave front at the output of the circuit $D_3$ is used to form the leading edge of the final output pulse of channel I, while the pulse wave front at the output of circuit $D_4$ will form the trailing edge of the final output pulse of channel I.

The outputs from circuits $D_3$ and $D_4$ are fed respectively to blocking oscillators 109 and 111. The output from oscillator 111 is fed through a stop pulse amplifier 113 to the input of oscillator 109, thereby cutting off the oscillator 109. Since the output from oscillator 111 generally is delayed from the output of circuit $D_3$, a pulse appears at the output of oscillator 109 having a width which is the difference between the delays of the circuits $D_4$ and $D_3$. This pulse is amplified without inversion by an amplifier 115 and then fed to a positive step recovery circuit 117 which improves the pulse rise time from approximately 30 nanoseconds at the output of amplifier 115 to less than 0.4 nanosecond at the output of circuit 117, a rise time improvement of 75 to 1.

The output pulse from oscillator 111 is fed through an inverter and amplifier 119 to form a negative step pulse which is applied to a negative step recovery circuit 121. The rise time of the leading edge of this pulse also is decreased from 30 nanoseconds to 0.4 nanosecond. The wave fronts of the pulses from circuits 117 and 121 are then applied to a diode adder 123 which couples them together to form a single output pulse of a width which is the difference between the delays of circuits $D_4$ and $D_3$. The leading edge is formed by the positive wave front of the pulse from circuit 117 while the trailing edge is formed by the negative wave front of the pulse from circuit 121. This single output pulse is then applied to the diode coupler 105 for application to the standard 50 ohm load 107.

A second output pulse is developed in channel II in a manner and with circuitry identical to that of channel I with the exception of the delay circuit $D_2$ which, as discussed hereinbefore, is adjustable to provide for variable spacing between the output pulses from respective channels.

DELAY CIRCUITS

The delay circuits $D_1$–$D_6$ (FIGURE 1) and the step recovery circuits 117 and 121 utilize the step recovery diodes mentioned hereinbefore. This type of diode is discussed in detail by J. L. Moll, S. Krakauer, and R. Shen, in "P-N Junction Charge Storage Diodes," Proc. IRE, vol. 50, No. 1, pp. 43–53, January 1962. During forward conduction of such diodes, it is believed minority carriers are confined close to the junction of the diode due to a built-in electric field and constitute a stored charge. A current suddenly applied in the reverse direction will conduct through the diode until the stored charge is depleted. The time taken for the depletion is termed the "storage phase." At the end of the storage phase, reverse conduction of the diode will drop to the low value typical of its reversed biased state. The depletion of the charge is very abrupt, thereby permitting very high speed switching of the reverse current into a load. The time taken for the abrupt step from reverse conduction to cutoff is known as the "transition time" of the diode.

Figure 5:
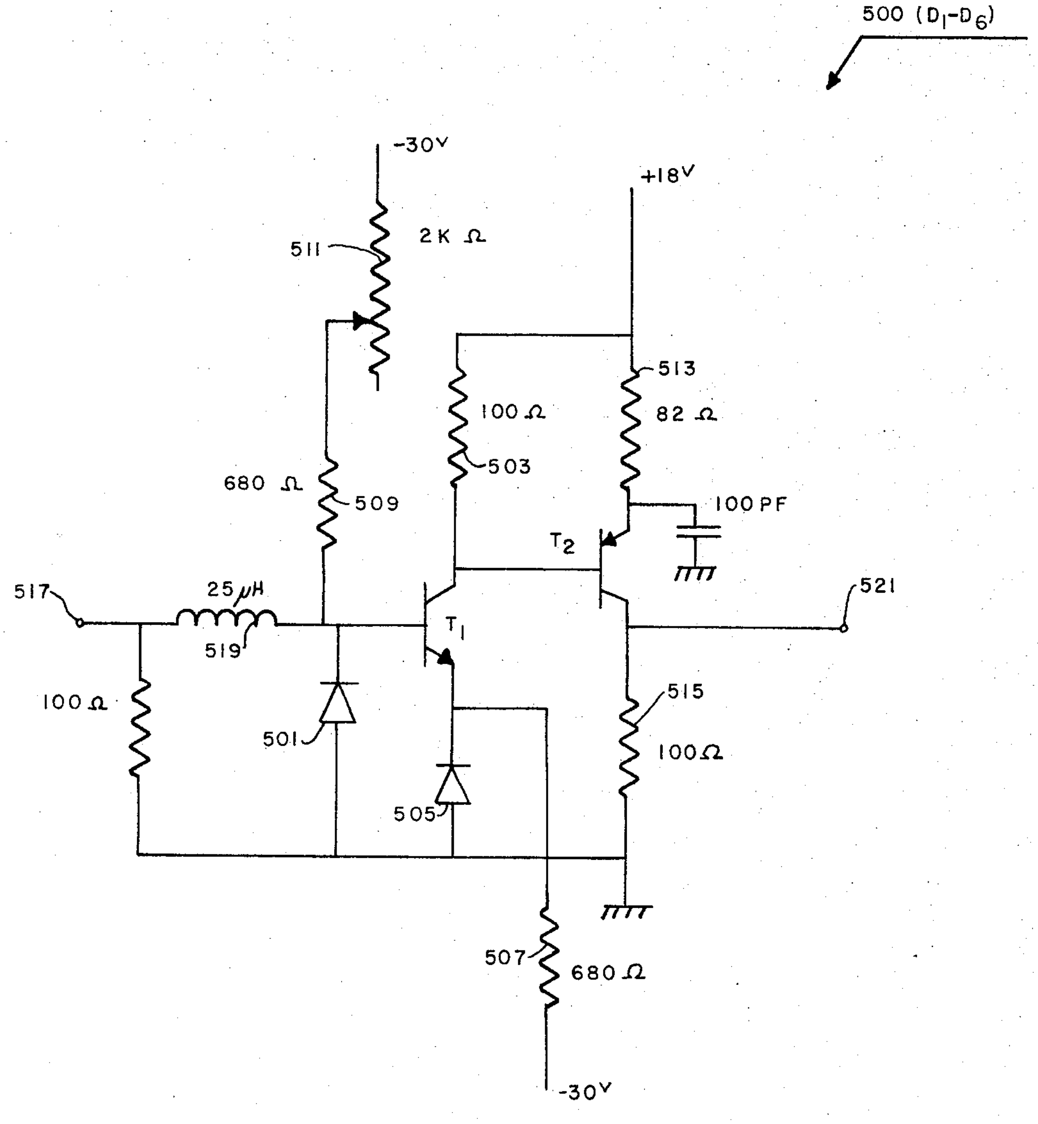
FIGURE 5 is a circuit diagram of a pulse delay circuit of the type used in the pulse generator of FIGURE 1.

Each of the delay circuits $D_1$–$D_6$ may be of a type 500 shown in FIGURE 5, comprising a transistor $T_1$, a transistor $T_2$, and a step recovery diode 501.

The transistor $T_1$ is connected between a +18 volt source and ground in series with a 100-ohm resistor 503 connected to the collector of $T_1$ and a diode 505 connected between ground and the emitter of $T_1$. The diode 505 normally is conducting between ground and a −30 volt source through a 680-ohm resistor 507. The emitter of transistor $T_1$, therefore, normally is held substantially at ground potential. The step recovery diode 501 is connected between ground and the base of transistor $T_1$ and normally is conducting in the forward direction from ground to a −30 volt source through a pair of series connected resistors 509 and 511. The base of transistor $T_1$, therefore, normally is held at substantially ground potential, maintaining the transistor $T_1$ cutoff. Transistor $T_2$ is connected between the +18 volt source and ground in series with a pair of resistors 513 and 515. Since the base of the transistor $T_2$ is connected to the collector of transistor $T_1$, both the emitter and base of transistor $T_2$ are at +18 volts ($T_1$ normally being cutoff), thereby normally maintaining the transistor $T_2$ cutoff.

Input pulses are applied to the delay circuit at an input terminal 517 and are conducted by a coil 519 to the base of the transistor $T_1$ and the cathode of the step recovery diode 501. Upon application of a unit step voltage in the positive direction such as shown in FIGURE 2, a current ramp is generated on the right end of the coil 519. Initially this current is conducted in the reverse direction into the step recovery diode. When the stored minority carriers (due to the normal forward current from ground to the −30 volt source) are depleted, a very abrupt step in current occurs, i.e. the step recovery diode ceases conduction in the reverse direction and the input pulse current ramp is conducted through the resistors 509 and 511 to the −30 volt source. The voltage at the base of transistor $T_1$ therefore rises abruptly. This rise creates a forward bias between the base and emitter of the transistor $T_1$, causing the transistor to conduct. As soon as transistor $T_1$ begins conduction, the emitter rises above ground, thereby applying a reverse bias to the diode 505. The diode 505 ceases conduction while the transistor continues to conduct between the +18 volt source and −30 volt source through the limiting resistor 507. This arrangement limits the amount of current through the transistor $T_1$ to prevent the transistor from saturating.

When transistor $T_1$ conducts, the voltage at the collector drops, causing the base of the transistor $T_2$ to become forward biased with respect to the emitter. As a result, the transistor $T_2$ conducts through the resistor 515, across which a normalized output pulse may be obtained at an output terminal 521.

It has been found that the greater the forward current through the step recovery diode 501 prior to application of the reverse current, the longer will be the storage phase, i.e. the time between the application of the reverse current and the abrupt change of the diode from conduction in the reverse direction to nonconduction. For a minimum delay therefore a large resistance is required in series with the step recovery diode 501 to limit the forward current. The resistor 511 is variable, and when fully in the circuit, it provides a minimum delay between the input pulse and the normalized output pulse. With the circuit 500 so adjusted, it is suitable for use as delay circuit $D_1$, $D_3$, and $D_5$ of FIGURE 1. The delay circuit 500 may also be used for any of the variable delay circuits $D_2$, $D_4$, and $D_6$, and when so used, the variable resistance may be adjusted to give desired pulse spacing and widths.

It will be noted that dependence of pulse width and spacing on temperature, power supply fluctuations, and input waveform fluctuations is minimized by the particular arrangement in FIGURE 1 of delay circuits $D_1$–$D_6$. For example, the same input waveform is applied to the circuits $D_1$ and $D_2$ and the circuits are subject to the same power supply and temperature fluctuations. Consequently, although the circuits $D_1$ and $D_2$ respond to these variations, the delay difference between their respective output waveforms remains constant, resulting in constant spacing between the pulses from channels I and II. Likewise, the width of the pulses developed in channels I and II do not vary significantly after being adjusted, since the respective widths are determined by the delay difference between the circuits $D_4$ and $D_3$ for channel I, and circuits $D_6$ and $D_5$ for channel II.

The drift of an individual delay circuit such as found in FIGURE 5 because of temperature variation may be analyzed as follows. As discussed, the snap action from high to low conductance of the diode 501 is achieved by applying a current ($I_r$) in the reverse direction to the diode. Normally, the diode 501 carries a current $I_f$ in the forward direction. After the storage phase, the difference current $I_r$–$I_f$ is switched into a load. The storage time $T_s$, in terms of effective minority carrier lifetime $\tau$ and forward and backward currents $I_f$ and $I_r$, can be obtained by integrating the charge continuity equation:

$$dQ/dt+Q/\tau=I(t)$$

where Q represents the total stored charge and $I(t)$ the current in the diode.

Assuming that the charge is extracted completely by $I_r$ and that the current $I_f$ has flowed for a time large compared to $\tau$, this yields:

$$T_s=\tau ln(1+I_f/I_r)$$

$\tau$ is the only diode parameter that influences the storage time. Since $\tau$ increases about 50% for a 70° C. temperature rise, the storage time increases by the same percentage causing temperature drift in time delays. If, e.g. in a typical delay circuit $\tau$=200 nsec., $I_f$=10 ma. and $I_r$=60 ma., the drift will be about 0.2 nsec./° C.

Reduction of its effect can be achieved by utilizing only time differences generated by pairs of diodes, such as done in FIGURE 1 for determining pulse width and spacing. A further drift reduction can be obtained by mounting the step recovery diodes on a common heat sink.

SPECIFIC DESCRIPTION

Since the manner in which pulses are developed in channels I and II are identical, the specific description will be made in reference only to channel I.

Referring to FIGURE 1, channel I may be considered as comprising two branches: an upper branch or "start" branch for developing the leading edge of the channel I output pulse, and a lower branch or "stop" branch for developing the trailing edge of the output pulse.

As discussed hereinbefore, positive step pulses are developed at the outputs of delay circuits $D_3$ and $D_4$. The output of the circuit $D_4$ is delayed from zero to 100 nanoseconds from the output pulse of the circuit $D_3$, depending upon the adjustment of the circuit $D_4$. The output pulse from the circuit $D_3$ is applied to an input terminal 125 (FIGURES 1 and 6), while the delayed output pulse from the circuit $D_4$ is applied to an input terminal 127 of the oscillator 111.

The blocking oscillator 109 comprises a normally nonconducting transistor $T_3$ (FIGURE 6), having its emitter connected directly to ground and its base connected to ground through a coil 601. The collector of the transistor $T_3$ is connected to a +14 volt source through a primary winding 603 on a core 605. A feedback secondary winding 607 is wound on the core and connected between ground and the base of the transistor $T_3$. An output secondary winding 608 couples pulses developed in the blocking oscillator 109 to the amplifier 115.

Figures 7, 8, 9, 10:
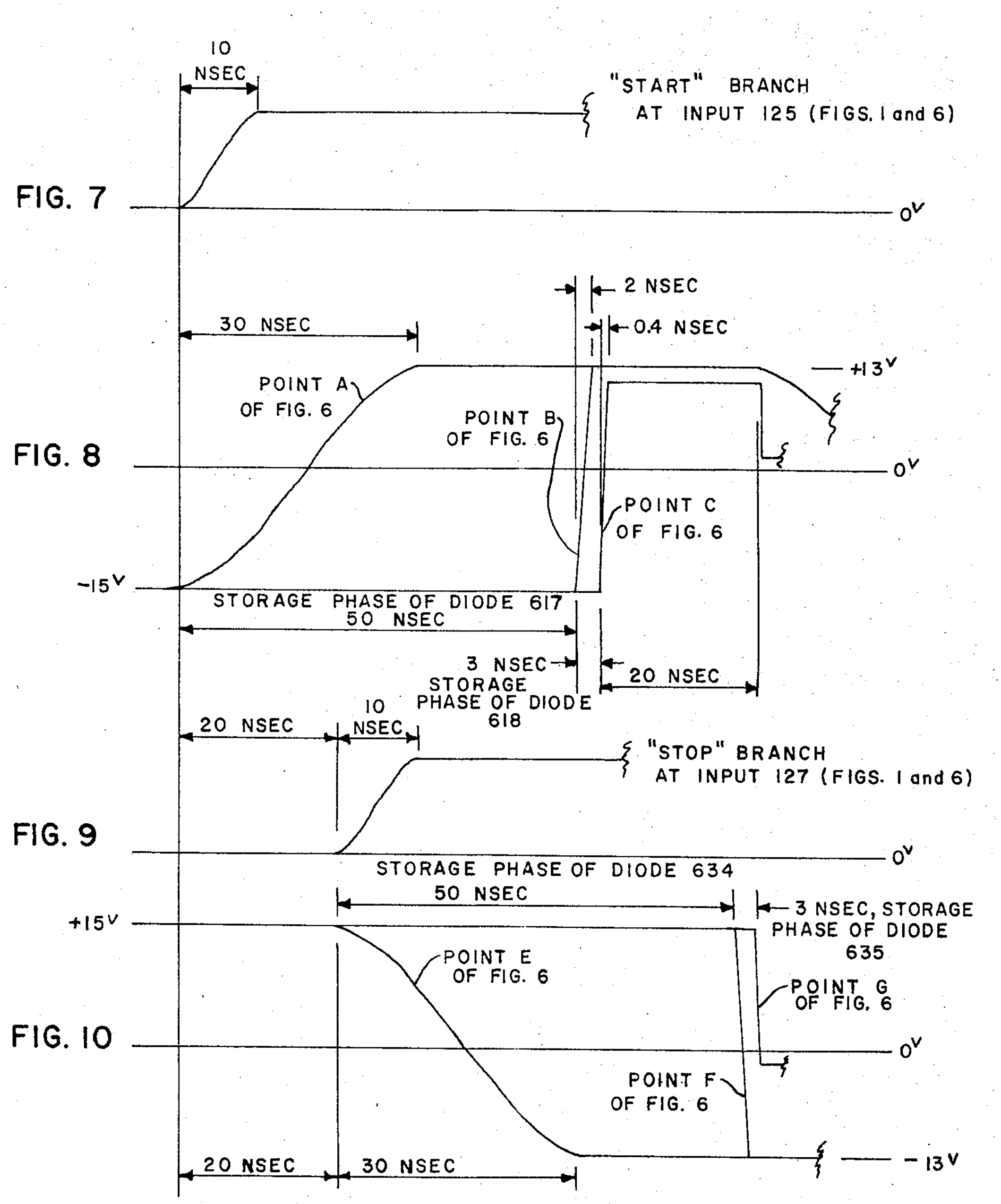
FIGURE 7 shows an idealized wave front applied to the input of the "start" branch of FIGURE 6.
FIGURE 8 shows idealized waveforms found at selected points in the "start" branch of FIGURE 6.
FIGURE 9 shows an idealized wave front applied to the input of the "stop" branch of FIGURE 6.
FIGURE 10 shows idealized waveforms found at selected points in the "stop" branch of FIGURE 6.

Application of a wave front such as shown in FIGURE 7 from the start delay circuit $D_3$ to the input terminal 125 raises the potential on the base of transistor $T_3$ with respect to the emitter, thereby causing the transistor $T_3$ to start conduction. The changing current in the winding 603, due to the increasing conduction of transistor $T_3$, induces a changing flux in the core 605 which in turn generates a voltage across the feedback winding 607 that is applied through a resistor 610 to the base of the transistor $T_3$. The voltage in the feedback winding is in such a direction as to raise the potential on the base of the transistor $T_3$ and thereby further increase the conduction of $T_3$.

After a delay of from zero to 100 nanoseconds, a wave front of the form shown in FIGURE 9 (which is identical to that of FIGURE 7, only delayed therefrom) is applied from the stop delay circuit $D_4$ to the input terminal 127 of the blocking oscillator 111. The circuit 111 comprises a normally nonconducting transistor $T_4$. The circuit 111 comprises components identical to the components of the circuit 109 and is operated in the same manner to produce a step output pulse for application to the amplifier 119. The blocking oscillator 111, however, comprises a core 611 on which a winding 613 has been added for coupling the changing flux in the core to the stop pulse amplifier 113. Consequently, simultaneous with the generation of the step pulse applied to the amplifier 111, a positive pulse is developed across the winding 613 for application between the base and emitter of a transistor $T_5$ of the stop pulse amplifier 113. This pulse biases the normally nonconducting transistor $T_5$ to conduction. The collector of transistor $T_5$ is connected to the base of the transistor $T_3$ and thereby lowers the potential on the base of $T_3$ to the potential found at the junction of a pair of resistors 614 and 615, which junction potential is below ground. The transistor $T_3$ is cutoff thereby.

Since the pulse applied to the terminal 125 from the start delay circuit $D_3$ may be considerably longer than the pulse developed in the output of the circuit 109, the coil 601 serves to block the wave front of the input pulse from ground and later to provide a DC path for the pulse to ground. This permits the transistor $T_3$ to deliver a short output pulse and then to remain nonconducting even though the input pulse continues to be present.

A square pulse is developed at the output of the blocking oscillator 109. This pulse is applied to the input of the amplifier 115 which comprises a pair of parallel connected transistors $T_6$ and $T_7$ which are normally cutoff. Upon application of a positive wave front to the input of amplifier 115, both transistors $T_6$ and $T_7$ start conducting. The collector of each of the transistors $T_6$ and $T_7$ is connected to a +14 volt source while the emitters are connected together to a point "A." Point A normally is at a potential of approximately −15 volts (for reasons presently described) but will rise to approximately +13 volts upon conduction of transistors $T_6$ and $T_7$. During such conduction a wave front is developed at point A of approximately the wave shape indicated in FIGURE 8, having a rise time of approximately 30 nanoseconds.

The wave front developed at point A is applied to the positive step recovery circuit 117 and results in a corresponding wave front developed at the output of the circuit 117 that has a very much improved rise time. Prior to application of the wave front at point A, a pair of step recovery diodes 617 and 618 are normally conducting between a −14 volt source and a −30 volt source. The diode 617 conducts serially through a resistor 620 to the −30 volt source while the diode 618 conducts serially through a resistor 621 to the −30 volt source. Normally, therefore, points A, B, and C are at a voltage level of approximately −15 volts as indicated in FIGURE 8.

When transistors $T_6$ and $T_7$ start conducting, conduction will be from the +14 volt source through the transistors, through a resistor 622 and into the step recovery diode 617 in the reverse direction. Consequently, even though the point A continues to rise, as indicated in FIGURE 8, point B remains at approximately −15 volts until the stored minority carriers in the diode 617 are depleted.

In order to obtain the full advantage of the switching characteristics of a step recovery diode, the storage phase of the diode should be longer than the rise time of the wave front applied to it. This allows sufficient time for the incoming wave front to attain full amplitude so that maximum power may be switched to the next state. As indicated in FIGURE 8, the storage phase of the diode 617 is approximately 50 nanoseconds and is longer than the 30-nanosecond rise time of the wave front at point A. At the end of the storage phase, the diode 617 abruptly stops conducting in the reverse direction. The transition or switching time from reverse conduction to nonconduction is approximately 2 nanoseconds as indicated in FIGURE 8. Consequently, at the end of the transition time of the diode 617, point B rises to approximately +13 volts.

Points B and C are connected together through a fast recovery diode 624 and a coil 625. As point B rises above the −15 volts at which point C is held, conduction of the transistors $T_6$ and $T_7$ is into the diode 618 in the reverse direction. As indicated in FIGURE 8, the storage phase of the diode 618 is approximately 3 nanoseconds, at the end of which time reverse conduction through the diode 618 is abruptly stopped.

Figure 11:
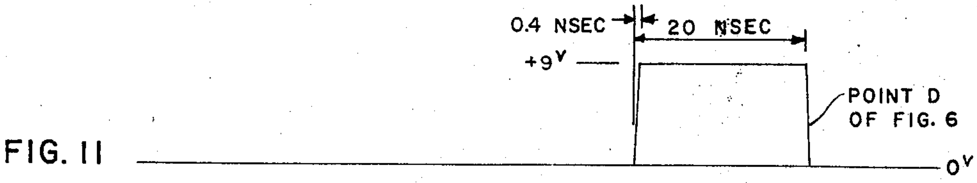
FIGURE 11 shows an idealized output pulse as related to and derived from the waveforms of FIGURES 7–10.

It may be noted that the storage phase of the diode 618 is longer than the transition time of the diode 617 in order to obtain the full advantage of the fast rise time of the diode 618. The transition time of the diode 618, indicated in FIGURE 8, is approximately 0.4 nanosecond. At the end of the transition time, the point C is at a value slightly less than the value at point B. When point C rises to 0 volts or ground potential during the transition, a diode 627 in the diode adder 123 and a diode 629 in the diode coupler 105 become forward biased. As a result, conduction of current through the transistors $T_6$ and $T_7$ is switched entirely through the standard 50-ohm load 107 to ground. The voltage at the cathode of the diode 627, indicated as point D in FIGURE 6, therefore rises as indicated in FIGURE 11, in approximately 0.4 nsec. The voltage rises to approximately 8 volts across the 50-ohm load.

Although the pulse developed at the output of the stop delay circuit $D_4$ (FIGURE 1) may be delayed from 0 to 100 nanoseconds from the pulse developed at the output of the start delay circuit $D_3$, for purposes of explanation it will be assumed that the stop delay circuit $D_4$ is adjusted to develop its output pulse 20 nanoseconds after the pulse from the start delay circuit $D_3$ is developed. Such a pulse, having a wave front with a rise of 10 nanoseconds, is shown in FIGURE 9. The beginning of the pulse is shown delayed 20 nanoseconds from the pulse shown in FIGURE 7. The pulse of FIGURE 9 is applied to blocking oscillator 111, causing operation of the oscillator in the manner discussed hereinbefore. An output pulse is developed thereby in the circuit 111 for application to the inverter amplifier 119.

The amplifier 119 comprises transistors $T_8$ and $T_9$ and is identical in components and arrangement with the amplifier 115. The amplifier 119, however, inverts the input pulse because of the polarity of the voltages applied thereto. The emitters of the transistors $T_8$ and $T_9$ are connected together to a −14 volt source, while the collectors are connected together to a +30 volt source through a pair of resistors 631 and 632 of the negative step recovery circuit 121. The circuit 121 comprises components identical with those of the positive step recovery circuit 117. The diodes, however, are reversed and the voltages applied to the circuit are positive rather than negative. The cathodes of a pair of step recovery diodes 634 and 635 are connected together to a +14 volt source while the anode of diode 634 is connected through the resistor 632 to a +30 volt source and the anode of the diode 635 is connected through a resistor 637 to the +30 volt source. Consequently, the diodes 634 and 635 normally are conducting in the forward direction, thereby clamping their respective anodes to the +14 volt source. The points indicated as E, F and G, therefore, normally are at approximately +15 volts.

Upon application of an input pulse to the inverter amplifier 119 the transistors $T_8$ and $T_9$ start conduction. Such conduction develops a wave front at point E similar to that indicated in FIGURE 10. Initially, conduction of the transistors $T_8$ and $T_9$ is through the diode 634 in the reverse direction and continues in this direction until the minority carriers in the diode are depleted. As indicated in FIGURE 10, the storage phase of the diode 634 is 50 nanoseconds, at the end of which time the diode abruptly stops conduction in the reverse direction. As a result, point F drops to approximately −13 volts, the voltage at point E. As point F drops, conduction through transistors $T_8$ and $T_9$ is from the diode 635 in the reverse direction.

This conduction continues through the storage phase of diode 635, which is 3 nanoseconds. At the end of this time, the minority carriers are depleted and the diode 635 abruptly stops conducting. The voltage at point G thereby rapidly drops to less than ground potential.

A diode 639 is connected in the diode adder 123 between the points D and G and normally is reverse biased. Normally, the point G is at a higher voltage (+15 v.) than point D (from ground to approximately +9 volts), including the period that the wave front of the pulse at point D is developed as indicated in FIGURE 11. However, at the end of the storage phase of the diode 635, point G drops below ground potential as indicated in FIGURE 10. Since this voltage is below the voltage at point D (+9 volts), the diode 639 becomes forward biased and conducts. As soon as the diode 639 begins conduction, the entire current through the transistors $T_8$ and $T_9$ is obtained through transistors $T_6$ and $T_7$. Since the current path through the amplifier 115 and circuit 117 is through components identical with those found in the circuit 121 and amplifier 119, the voltage at point D will fall to precisely zero or ground level in approximately 0.4 nanosecond.

Figure 6:
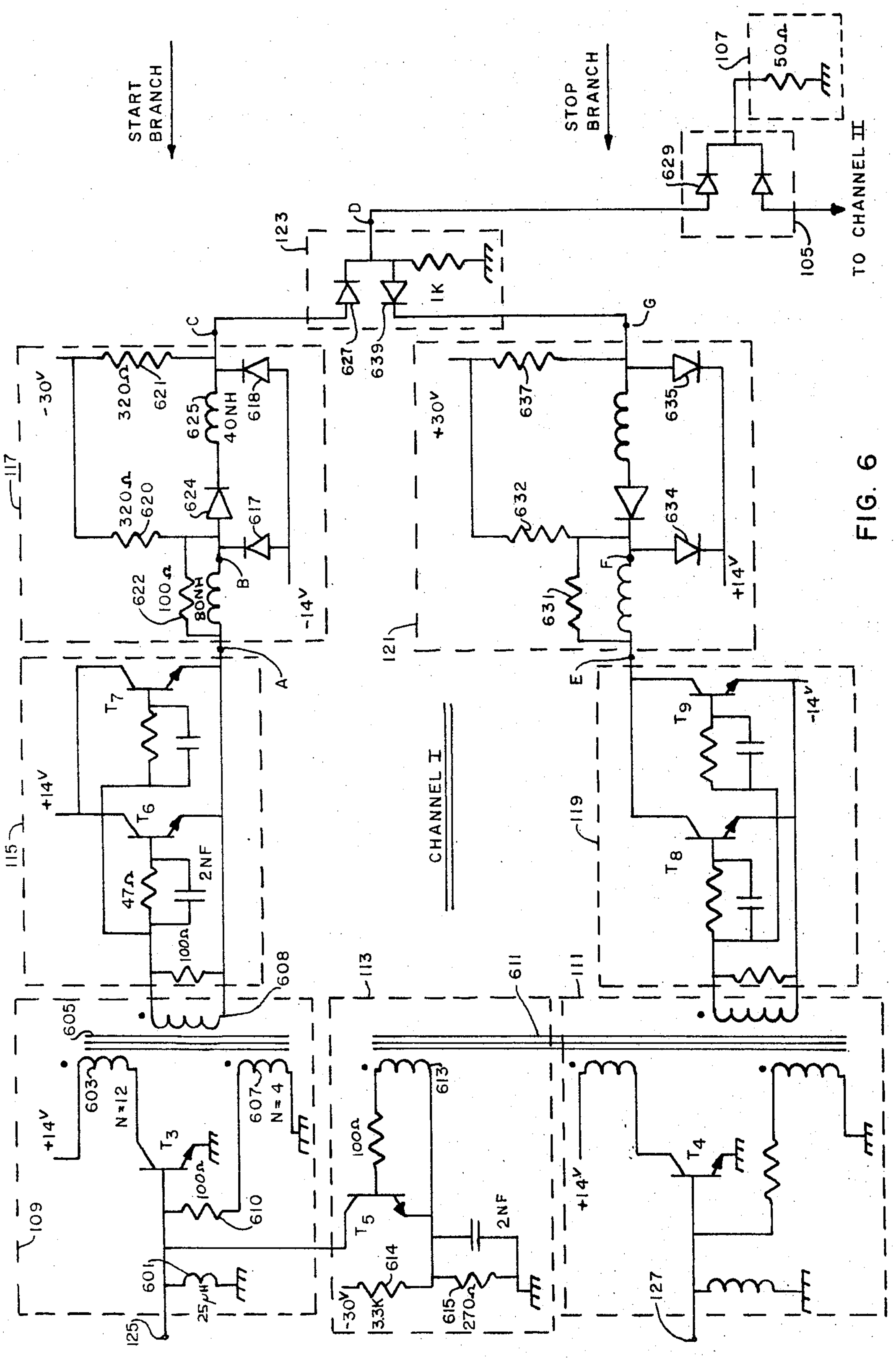
FIGURE 6 is a circuit diagram of portions of channel I of FIGURE 1 comprising "start" and "stop" branches.

From the circuits of FIGURE 6, therefore, an output pulse is obtained across the 50 ohm load 107 that is approximately 20 nanoseconds wide, with rise and fall times of approximately 0.4 nanosecond.

Subsequent to the above operation, the "start" branch is cut off relatively slowly by the termination of the pulse applied to the input of the amplifier 115. At such time the anode voltage of the diode 627 goes to −14 volts. Following this, the pulse applied to the input of the amplifier 119 is terminated also and the "stop" branch is switched off. At this time the anode of diode 639 returns to ground and the entire pulse generator is ready for the next cycle.

The invention claimed is:

1. A double pulse generator, comprising:

(a) a source of input pulses;

(b) a first step recovery diode having a storage phase and connected to said source for delaying each of said input pulses a first predetermined period equal to said storage phase;

(c) means connected to said first diode for developing a first output pulse having fast rise and fall times and a predetermined polarity;

(d) a second step recovery diode having a storage phase and connected to said source for delaying each of said input pulses a second predetermined period equal to said storage phase, said second period being longer than said first period; and (e) means connected to said second diode for developing a second output pulse having fast rise and fall times and said predetermined polarity, said second pulse being delayed from said first pulse by a period equal to the difference between said second and first periods.

2. A double pulse generator according to claim 1 including means for adjusting the storage phase of said second step recovery diode to delay said input pulses from said first period to a predetermined maximum second period.

3. A double pulse generator, comprising:

(a) a source of input pulses;

(b) a first step recovery diode having a storage phase;

(c) means for normally supplying forward current to said first diode to predetermine said storage phase;

(d) means for applying an input pulse to said first diode in opposition to said forward current to begin said storage phase;

(e) means including said first diode responsive to termination of said storage phase for developing a first normalized wave front, delayed from the wave front of said input pulse by the period of said storage phase;

(f) a second step recovery diode having a storage phase;

(g) means for normally supplying a forward current to said second diode to predetermine the storage phase of said second diode;

(h) means for adjusting the forward current through said second diode to select a predetermined period for the storage phase of said second diode;

(i) means for applying said input pulse to said second diode in opposition to the forward current therein to begin the storage phase of said second diode;

(j) means including said second diode responsive to termination of the storage phase of said second diode for developing a second normalized wave front, delayed from the wave front of said input pulse by the period of the storage phase of said second diode; and (k) means responsive to said normalized wave fronts for developing corresponding first and second output pulses of identical polarity, said second output pulse being delayed from said first output pulse by the difference of the storage phases of said second and first diodes.

4. A double pulse generator for generating pulses having fast rise and fall times, comprising:

(a) a source of input pulses;

(b) a first step recovery diode having a storage phase and connected to said source for developing a first wave front delayed for a first predetermined period equal to said storage phase from the wave front of each input pulse applied thereto;

(c) a second step recovery diode having a storage phase and connected to said first diode for delaying said first wave front for a second predetermined period equal to the storage phase of said second diode;

(d) a third step recovery diode having a storage phase and connected to said first diode for delaying said first wave front for a third predetermined period equal to the storage phase of said third diode;

(e) a first output circuit connected to said second and third step recovery diodes for developing a first single output pulse having leading and trailing edges, said leading edge being separated from said trailing edge for a period equal to the difference between said third and second predetermined periods;

(f) a fourth step recovery diode having a storage phase and connected to said source for developing a second wave front delayed from each input pulse applied thereto for a fourth predetermined period equal to the storage phase of said fourth diode;

(g) a fifth step recovery diode having a storage phase and connected to said fourth diode for delaying said second wave front for a fifth predetermined period equal to the storage phase of said fifth diode;

(h) a sixth step recovery diode having a storage phase and connected to said fourth diode for delaying said second wave front for a sixth predetermined period equal to the storage phase of said sixth diode;

(i) a second output circuit connected to said fifth and sixth step recovery diodes for developing a second single output pulse having leading and trailing edges which are separated for a period equal to the difference between the storage phases of said fifth and sixth step recovery diodes;

(j) a load; and (k) means for coupling said first and second output circuits to said load, whereby said first and second output pulses appear across the load separated by a period equal to the difference between the storage phases of said first and fourth step recovery diodes.

5. A double pulse generator according to claim 4 including: circuit means for changing the storage phases of said third, fourth and sixth step recovery diodes to adjust the widths of said first and second output pulses and the separation therebetween respectively.

6. A double pulse generator for generating pulses having fast rise and fall times, comprising:

(a) a source of input pulses;

(b) a first step recovery diode having a storage phase;

(c) means for normally supplying forward current to said first diode to predetermine said storage phase;

(d) means for applying an input pulse from said source to said first diode in opposition to said forward current to begin said storage phase;

(e) means responsive to termination of said storage phase for developing a first wave front delayed from the wave front of each input pulse applied thereto for a period equal to said storage phase;

(f) a second step recovery diode having a storage phase;

(g) means for normally supplying a forward current to said second diode to predetermine the storage phase of said second diode;

(h) means for applying said delayed first wave front to said second diode in opposition to the forward current therein to begin the storage phase of said second diode;

(i) a third step recovery diode having a storage phase;

(j) means for normally supplying a forward current to said third diode to predetermine the storage phase of said third diode;

(k) means for applying said delayed first wave front to said third diode in opposition to the forward current therein to begin the storage phase of said third diode;

(l) a first output circuit connected to said second and third diodes for developing a first single output pulse having leading and trailing edges, said leading edge being separated from said trailing edge for a period equal to the difference between the storage phases of said third and second diodes;

(m) a fourth step recovery diode having a storage phase;

(n) means for normally supplying a forward current to said fourth diode to predetermine the storage phase of said fourth diode;

(o) means for applying said input pulse to said fourth diode in opposition to the forward current therethrough to begin the storage phase of said fourth diode;

(p) means responsive to termination of the storage phase of said fourth diode for developing a second wave front delayed from the wave front of the input pulse applied thereto for a period equal to the storage phase of said fourth diode;

(q) a fifth step recovery diode having a storage phase;

(r) means for normally supplying a forward current to said fifth diode to predetermine the storage phase thereof;

(s) means for applying said delayed second wave front to said fifth diode in opposition to the forward current therethrough to begin the storage phase of said fifth diode;

(t) a sixth step recovery diode having a storage phase;

(u) means for normally supplying a forward current to said sixth diode to predetermine the storage phase thereof;

(v) means for applying said delayed second wave front to said sixth diode in opposition to the forward current therethrough to begin the storage phase of the said sixth diode;

(w) a second output circuit connected to said fifth and sixth diodes for developing a second single output pulse having leading and trailing edges, said leading edge being separated from said trailing edge for a period equal to the difference between the storage phases of said fifth and sixth diodes;

(x) a load; and (y) circuit means for coupling said first and second output pulses to said load, whereby said first and second output pulses appear across the load separated by a period equal to the difference between the storage phases of said fourth and first step recovery diodes.

7. A double pulse generator according to claim 6 including: circuit means for changing the normal forward currents through said third, fourth and sixth step recovery diodes to change the storage phases thereof and thereby adjust the width of said first and second output pulses and the separation therebetween respectively.

References Cited

UNITED STATES PATENTS

| | | | |
|---|---|---|---|
| 3,076,902 | 2/1963 | Van Duzer et al. ---- | 307—88.5 |
| 3,078,377 | 2/1963 | Brunschweiger ------ | 307—88.5 |
| 3,205,376 | 9/1965 | Berry et al. -------- | 307—88.5 |

JOHN S. HEYMAN, *Primary Examiner.*

ARTHUR GAUSS, *Examiner.*